United States Patent
Jia et al.

(10) Patent No.: US 10,440,820 B2
(45) Date of Patent: Oct. 8, 2019

(54) SUBSTRATE ASSEMBLY, DISPLAY SUBSTRATE MOTHERBOARD, DISPLAY SUBSTRATE, AND PRODUCTION METHOD, DISPLAY

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Wenbin Jia, Beijing (CN); Li Sun, Beijing (CN); Minghung Hsu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/716,305

(22) Filed: Sep. 26, 2017

(65) Prior Publication Data
US 2018/0184519 A1  Jun. 28, 2018

(30) Foreign Application Priority Data

Dec. 28, 2016  (CN) .......................... 2016 1 1238294

(51) Int. Cl.
*H05K 1/03* (2006.01)
*H05K 1/18* (2006.01)
(Continued)

(52) U.S. Cl.
CPC .......... *H05K 1/0393* (2013.01); *H01L 51/003* (2013.01); *H01L 51/0097* (2013.01);
(Continued)

(58) Field of Classification Search
None
See application file for complete search history.

(56) References Cited

U.S. PATENT DOCUMENTS

2015/0060870 A1* 3/2015 Ro ....................... H01L 27/1218
257/72

FOREIGN PATENT DOCUMENTS

CN     102468452 A    5/2012
CN     204118054 U    1/2015
(Continued)

OTHER PUBLICATIONS

Satoshi et al. English translation JP2000243943 A, Sep. 8, 2000, pp. 1-14 (Year: 2000).*
(Continued)

*Primary Examiner* — Shaun M Campbell
(74) *Attorney, Agent, or Firm* — Kinney & Lange, P.A.

(57) ABSTRACT

Embodiments of this disclosure provide a substrate assembly, a display substrate motherboard, a display substrate, and a production method, and a display, and relate to the technical field of flexible display. The damage of the support substrate and the flexible base substrate upon separation may be avoided, and the bulging phenomenon of the connecting layer occurred at a high temperature may be prevented. This substrate assembly comprises a support substrate as well as a connecting layer and a flexible base substrate which are sequentially formed on the support substrate, wherein the material of the connecting layer comprises an organic layered material, and the molecule constituting the organic layered material comprises a hydrophilic group. The substrate assembly is used for producing a flexible display substrate.

18 Claims, 3 Drawing Sheets

(51) Int. Cl.
*H05K 1/05* (2006.01)
*H01L 51/00* (2006.01)
*H01L 51/52* (2006.01)
H01L 27/32 (2006.01)
H05K 3/00 (2006.01)

(52) U.S. Cl.
CPC ......... *H01L 51/5253* (2013.01); *H05K 1/056* (2013.01); *H05K 1/189* (2013.01); *H01L 27/3244* (2013.01); *H01L 2227/326* (2013.01); *H05K 3/007* (2013.01)

(56) References Cited

FOREIGN PATENT DOCUMENTS

| | | |
|---|---|---|
| CN | 105219285 A | 1/2016 |
| JP | 2000243943 A | 9/2000 |

OTHER PUBLICATIONS

First Chinese Office Action, for Chinese Patent Application No. 201611238294.7, dated Dec. 5, 2017, 13 pages.

\* cited by examiner

SUBSTRATE ASSEMBLY, DISPLAY SUBSTRATE MOTHERBOARD, DISPLAY SUBSTRATE, AND PRODUCTION METHOD, DISPLAY

CROSS-REFERENCE TO RELATED APPLICATION

This application claims priority benefits of Chinese Application No. 201611238294.7 filed on Dec. 28, 2016, the entire contents of which are hereby incorporated by reference.

TECHNICAL FIELD

This disclosure relates to the technical field of flexible display, and particularly to a substrate assembly, a display substrate motherboard, a display substrate, and a production method, and a display.

BACKGROUND

With the development of science and technology, the technical field of display changes rapidly. The types of displays become more and more, and for example, include liquid crystal displays (simply referred to as LCDs), organic light-emitting diode displays (simply referred to as OLEDs), electrophoretic displays, etc. These displays may be divided into rigid displays and flexible displays according to whether they are easily bent. Here, since the flexible display may be coiled, folded, even worn, and the like, it becomes a good portable product and is more and more favored by consumers.

A production method of a flexible display substrate mainly comprises the steps of: first providing a rigid support substrate, for example a glass, and then forming an adhesive layer on the rigid support substrate; next depositing or adhering a layer of a flexible base substrate on the adhesive layer and then forming a patterned display element on the flexible base substrate; and finally separating the flexible base substrate from the rigid substrate to obtain a flexible display substrate.

At present, physical separation is mainly used in the method for separating a rigid substrate from a flexible base substrate. However, the physical separation is prone to damage the rigid substrate and the flexible base substrate, thereby resulting in that the rigid substrate fails to be recovered and reutilized, which increases the cost and reduces the qualification rate of flexible display substrates. Furthermore, in the prior art, the materials of adhesive layers are all polymer materials, for example parylene. In this way, in the process of forming other film layers on the flexible base substrate, since the temperature is relatively high, the stability of the polymer is reduced and the bulging phenomenon of the adhesive layer will easily occur. Therefore, the film layers formed on the flexible base substrate are uneven.

SUMMARY

Embodiments of this disclosure provide a substrate assembly, a display substrate motherboard, a display substrate, and a production method, a display. The damage of the support substrate and the flexible base substrate upon separation may be avoided, and the bulging phenomenon of the connecting layer occurred at a high temperature may be prevented.

Particularly, embodiments of this disclosure employ the following technical solutions.

In a first aspect, there is provided a substrate assembly, comprising a support substrate as well as a connecting layer and a flexible base substrate which are sequentially formed on the support substrate, wherein the connecting layer comprises an organic layered material, and the molecule constituting the organic layered material comprises a hydrophilic group.

Preferably, the connecting layer is mainly composed of an organic layered material.

Preferably, the connecting layer is composed of an organic layered material.

Preferably, the molecule constituting the organic layered material is an organic linear molecule.

Preferably, the organic linear molecule is a small molecule or an oligomer.

Preferably, the connecting layer has a thickness in a range of 10 to 100 nm.

Preferably, the molecule constituting the organic layered material comprises a group capable of being ionized by a polar solvent comprising a hydroxy group.

Preferably, the hydrophilic group is capable of being ionized by a polar solvent comprising a hydroxy group.

Preferably, the hydrophilic group is one or more selected from the group consisting of a hydroxy group, an aldehyde group, a carboxy group, an amino group, a phosphoric acid group, and a sulfonic acid group.

Preferably, the border of the flexible base substrate is within the border of the connecting layer when looking from the direction vertical to the surface of the flexible base substrate.

In a second aspect, there is provided a flexible display substrate motherboard, comprising the substrate assembly described above as well as a display element formed on the flexible base substrate of the substrate assembly and an encapsulating layer encapsulating the display element.

In a third aspect, there is provided a flexible display substrate, which is obtained by peeling the flexible base substrate of the flexible display substrate motherboard described above from the support substrate.

In a fourth aspect, there is provided a flexible display, comprising the flexible display substrate described above.

In a fifth aspect, there is provided a production method of a flexible display substrate, comprising the steps of:
a) forming a connecting layer on a support substrate, wherein the connecting layer comprises an organic layered material, and the molecule constituting the organic layered material comprises a hydrophilic group;
b) sequentially forming a flexible base substrate and a display element on the connecting layer;
c) forming an encapsulating layer encapsulating the display element to obtain a flexible display substrate motherboard; and
d) placing the flexible display substrate motherboard in an atmosphere of a polar solvent comprising a hydroxy group to allow the organic layered material to be swollen and separated under the action of the polar solvent, so that the support substrate and the flexible base substrate are separated to obtain a flexible display substrate.

Preferably, in step d), the method further comprises the step of: subjecting the flexible display substrate motherboard to heating or ultrasonication.

Preferably, in step a), the method comprises the step of: coating a solution in which an organic material is dissolved on the support substrate, and precipitating an organic layered material on the support substrate using a crystallization process to form the connecting layer, wherein the molecule constituting the organic material comprises a hydrophilic group.

Preferably, the connecting layer is mainly composed of an organic layered material.

Preferably, the connecting layer is composed of an organic layered material.

Preferably, the molecule constituting the organic layered material is an organic linear molecule.

Preferably, the organic linear molecule is a small molecule or an oligomer.

Preferably, the connecting layer has a thickness in a range of 10 to 100 nm.

Preferably, the molecule constituting the organic layered material comprises a group capable of being ionized by a polar solvent comprising a hydroxy group.

Preferably, the hydrophilic group is capable of being ionized by a polar solvent comprising a hydroxy group.

Preferably, the hydrophilic group is one or more selected from the group consisting of a hydroxy group, an aldehyde group, a carboxy group, an amino group, a phosphoric acid group, and a sulfonic acid group.

Preferably, the border of the flexible base substrate is within the border of the connecting layer when looking from the direction vertical to the surface of the flexible base substrate.

BRIEF DESCRIPTION OF THE DRAWINGS

In order to illustrate the technical solutions in embodiments of this disclosure or in the prior art more clearly, figures required for describing the embodiments or the prior art will be simply introduced below. It is apparent that the figures described below are merely some embodiments of this disclosure, and other figures may be further obtained by the ordinary skilled person in the art according to these figures without exerting inventive work.

REFERENCE NUMERALS

01—a substrate assembly; 10—a support substrate; 20—a connecting layer; 30—a flexible base substrate; 40—a display element; 401—a anode; 402—a hole injection layer; 403—a hole transport layer; 404—an organic light-emitting layer; 405—an electron injection layer; 406—an electron transport layer; 407—a cathode; 50—an encapsulating layer; 501—a protective layer; 502—a compact layer; 503—a coating layer; 504—a stress release layer; 505—a soft layer; 60—a flat buffering layer.

DETAILED DESCRIPTION

The technical solutions in embodiments of this disclosure will be clearly and fully described below in conjunction with accompanying drawings in embodiments of this disclosure. Obviously, the embodiments described are merely a part of the embodiments of this disclosure, rather than all of the embodiments. Based on the embodiments of this disclosure, all other embodiments obtained by those of ordinary skill in the art without performing inventive work belong to the scope protected by this disclosure.

Embodiments of this disclosure provide a substrate assembly, a display substrate motherboard, a display substrate, and a production method, a display. Since the material of the connecting layer comprises an organic layered material and the molecule constituting the organic layered material comprises a hydrophilic group, there is a very strong hydrogen bond action between the molecule of a polar solvent comprising a hydroxy group and the hydrophilic group when the substrate assembly is placed in the atmosphere of the polar solvent comprising a hydroxy group. Therefore, the molecule of the polar solvent comprising a hydroxy group will be easily inserted into a space between layers of the organic layered material, so that the organic layered material is swollen and separated. Thus, the support substrate and the flexible base substrate will be easily exfoliated. Compared to the conventional physical separated support substrates and flexible base substrates, the support substrate and the flexible base substrate are skillfully and gently separated by swelling and separation of the organic layered material in embodiments of this disclosure, and therefore the damage of the support substrate and the flexible base substrate upon separation may be avoided. On this basis, since the materials of the connecting layer are organic layered materials and the organic layered materials are all small molecule or oligomer materials rather than higher polymer materials, the bulging phenomenon of the organic layered material will not occur even if the temperature is relatively high when film layers are formed on the flexible base substrate. The evenness of the film layers formed on the flexible base substrate may be in turn ensured.

Figure 1:
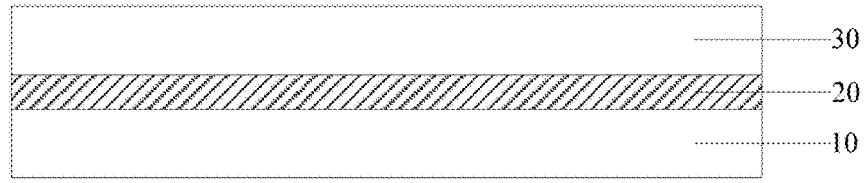
FIG. 1 is a structural schematic diagram of a substrate assembly provided in an embodiment of this disclosure.

An embodiment of this disclosure provides a substrate assembly, as shown in FIG. 1, comprising a support substrate 10 as well as a connecting layer 20 and a flexible base substrate 30 which are sequentially formed on the support substrate 10, wherein the material of the connecting layer 20 comprises an organic layered material and the molecule constituting the organic layered material comprises a hydrophilic group.

First, it is to be indicated that the material of the support substrate 10 is not limited. Since the function of the support substrate 10 is supporting some film layers or elements, the support substrate 10 is typically a rigid substrate. For example, the support substrate 10 may be glass.

Second, the function of the connecting layer 20 is connecting the support substrate 10 and the flexible base substrate 30 together. The materials of the connecting layer 20 may be all organic layered materials, or may be organic layered materials doped with a small amount of inorganic materials.

The organic layered material refers to a material composed of two or more sheet layers. Here, the interior of each two-dimensional layer is bonded via a strong chemical bond and there is only a weak interaction force between a lower layer and an upper layer.

Here, the hydrophilic group comprised in the molecule constituting the organic layered material is not limited. The hydrophilic group may be, for example, a hydroxy group (—OH), an aldehyde group (—CHO), a carboxy group (—COOH), an amino group (—NH$_2$), a sulfonic acid group (—SO$_3$H), etc. Furthermore, the molecule constituting the organic layered material may comprise one hydrophilic group, or may comprise various hydrophilic groups.

Figure 2:
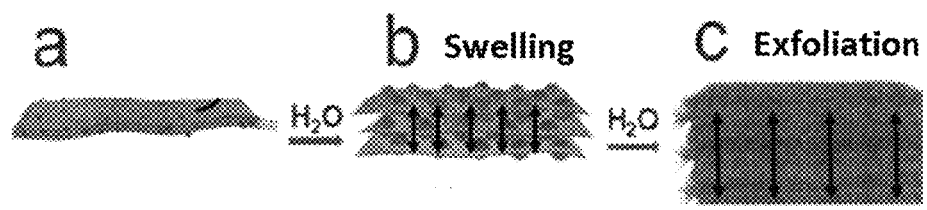
FIG. 2 is a schematic diagram of an exfoliation process of an organic layered material provided in an embodiment of this disclosure.

Here, there is a very strong hydrogen bond action between the hydrophilic group and the polar solvent comprising a hydroxy group. Therefore, as shown in FIG. 2, if the substrate assembly is placed in the atmosphere of the polar solvent comprising a hydroxy group, the molecule of the polar solvent comprising a hydroxy group will be easily inserted between sheet layers of the organic layered material under the action of the hydrogen bond, thereby resulting in swelling of the layer material. When the process of swelling progresses to a certain extent, there is no longer correlation between sheet layers of the organic layered material, so that the separation occurs between layers. The driving force for constructing the sheet layers in the organic layered material is typically a relatively weak intermolecular action force, for example Van-der-Waals force. However, the sheet layer structure constructed by this weak action force is not stable, and the action force between layers is damaged in the process of swelling, so that separation occurs between layers. FIG. 2 of this disclosure illustrates the exfoliation process of an organic layered material in detail wherein the polar solvent comprising a hydroxy group is water.

On this basis, if the thickness of the connecting layer 20 is too large, sheet layers of the organic layered material may be not easily separated; and if the thickness of the connecting layer 20 is too small, it may be disadvantageous to the connection of the support substrate 10 and the flexible base substrate 30. On this basis, in embodiments of this disclosure, the thickness of the connecting layer 20 is preferably in a range of 10 to 100 nm, and more preferably about 10 nm.

Third, the material of the flexible base substrate 30 is not limited, and for example, may be polyimide, polystyrene, etc. The thickness of the flexible base substrate 30 is not limited, and may be set as needed. Preferably, the thickness of the flexible base substrate 30 is typically about 100 μm.

An embodiment of this disclosure provides a substrate assembly. Since the connecting layer 20 comprises an organic layered material and the molecule constituting the organic layered material comprises a hydrophilic group, there is a very strong hydrogen bond action between the molecule of a polar solvent comprising a hydroxy group and a hydrophilic group when the substrate assembly is placed in the atmosphere of the polar solvent comprising a hydroxy group. Therefore, the molecule of the polar solvent comprising a hydroxy group will be easily inserted into a space between layers of the organic layered material, so that the organic layered material is swollen and separated. Thus, the support substrate 10 and the flexible base substrate 30 will be easily exfoliated. Compared to the conventional physical separated support substrates 10 and flexible base substrates 30, the support substrate 10 and the flexible base substrate 30 are skillfully and gently separated by swelling and separation of the organic layered material in embodiments of this disclosure, and therefore the damage of the support substrate 10 and the flexible base substrate 30 upon separation may be avoided. On this basis, since the material of the connecting layer 20 comprises organic layered materials and the organic layered materials are all small molecule or oligomer materials rather than higher polymer materials, the bulging phenomenon of the organic layered material will not occur even if the temperature is relatively high when film layers are formed on the flexible base substrate 30. The evenness of the film layers formed on the flexible base substrate 30 may be in turn ensured.

Preferably, the molecule constituting the organic layered material is an organic linear molecule, and the organic linear molecule is a small molecule or an oligomer.

The organic linear molecule refers to a long chain-like molecule connected by a C—C bond or a C—C bond and a C—O bond. Here, the molecular structure of the organic linear molecule may be branched, or may be unbranched. Molecules are closely bonded by intermolecular action force.

Here, the particular molecular structure of the organic linear molecule is not limited, as long as an organic layered material may be obtained by arranging a plurality of organic linear molecules in a certain direction. Exemplarily, the organic linear molecule may be, for example, a terephthalamide oligomer linear molecule containing sulfonate. Particularly, the molecular formula of the terephthalamide oligomer linear molecule containing sulfonate is:

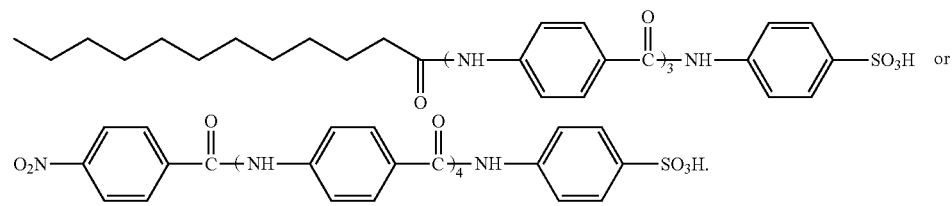

Since a terephthalamide oligomer comprises a benzene ring and an amido bond and a relatively strong intermolecular action force (i.e., an intermolecular hydrogen bond and a π-π stacking action) may be introduced to the benzene ring and the amido bond, a planar bidirectional effect network will be formed so as to construct a sheet layered structure.

According to an embodiment of this disclosure, when the substrate assembly is placed in the atmosphere of the polar solvent comprising a hydroxy group, the molecule of the polar solvent comprising a hydroxy group will be inserted into a space between layers of the organic layered material. Since the organic layered material is constructed from a plurality of organic linear molecules when the molecule of the organic layered material is an organic linear molecule, the sheet layers of the organic layered material are more easily separated so as to allow the support substrate 10 and the flexible base substrate 30 to be more easily separated.

Preferably, the hydrophilic group is capable of being ionized by a polar solvent comprising a hydroxy group; and/or, the molecular structure of the organic layered material further comprises a group capable of being ionized by a polar solvent comprising a hydroxy group.

Here, the type of the polar solvent comprising a hydroxy group is not limited. The polar solvent comprising a hydroxy group may be, for example, water ($H_2O$), methanol ($CH_3OH$), ethanol ($CH_3CH_2OH$), etc.

It is to be indicated that since the molecule constituting the organic layered material comprises a group capable of being ionized by a polar solvent comprising a hydroxy group, this group may be ionized by the polar solvent comprising a hydroxy group to become an ion when the organic layered material is placed in the atmosphere of the organic layered material. Exemplarily, the molecule constituting the organic layered material comprises a sulfonic acid group, and the sulfonic acid group may be ionized by the polar solvent comprising a hydroxy group to become a sulfonate ion ($HSO_3^-$).

Here, the hydrophilic group may be a group capable of being ionized by a polar solvent comprising a hydroxy group, for example a sulfonic acid group, a phosphoric acid group, an amino group, etc., or may be a group not capable of being ionized by a polar solvent comprising a hydroxy group, for example a hydroxy group, an aldehyde group, a carboxy group, etc. On this basis, when the hydrophilic group is not capable of being ionized by a polar solvent comprising a hydroxy group, the molecular structure of the organic layered material comprises both a hydrophilic group and a group capable of being ionized by a polar solvent comprising a hydroxy group.

According to an embodiment of this disclosure, since the hydrophilic group is capable of being ionized by a polar solvent comprising a hydroxy group; and/or the molecular structure of the organic layered material further comprises a group capable of being ionized by a polar solvent comprising a hydroxy group, there is a relatively strong repulsion effect between ions when the group in the molecular structure of the organic layered material is ionized by a polar solvent comprising a hydroxy group to become an ion. The repulsion effect between ions may further accelerate the swelling and the separation between layers of the organic layered material, which is in turn favorable to the separation of the support substrate 10 from the flexible base substrate 30.

Preferably, the border of the flexible base substrate 30 is within the border of the connecting layer 20 when looking from the direction vertical to the surface of the flexible base substrate 30.

Here, the direction vertical to the surface of the flexible base substrate 30 refers to the thickness direction of the flexible base substrate 30.

According to an embodiment of this disclosure, since the border of the flexible base substrate 30 is within the border of the connecting layer 20, on the one hand, the connecting layer 20 may be used to connect the flexible base substrate 30 and the support substrate 10 together; on the other hand, the flexible base substrate 30 and the support substrate 10 may be completely separated when the organic layered material in the connecting layer 20 is swollen and separated.

An embodiment of this disclosure provides a flexible display substrate motherboard, as shown in FIGS. 3-6, comprising the substrate assembly 01 described above as well as a display element 40 formed on the flexible base substrate 30 in the substrate assembly 01 and an encapsulating layer 50 for coating the display element 40.

Figure 5:
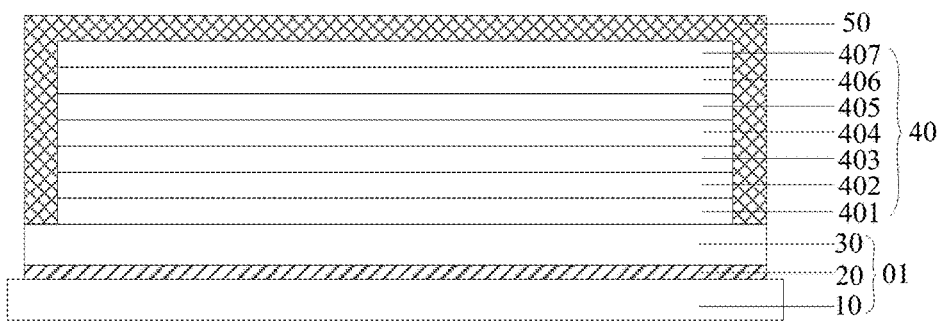
FIG. 5 is a third structural schematic diagram of a flexible display substrate motherboard provided in an embodiment of this disclosure.

Here, the particular structure of the display element 40 is not limited. The structure of the display element 40 is determined according to the type of the flexible display substrate motherboard. Here, the flexible display substrate motherboard is used for forming a flexible display substrate. When the flexible display substrate is a liquid crystal display substrate (simply referred to as LCD), the display element 40 comprises a thin film transistor, a pixel electrode, etc.; when the flexible display substrate is an organic light-emitting diode display substrate (simply referred to as OLED), as shown in FIG. 5, the display element 40 comprises an anode 401, a hole injection layer 402 and a hole transport layer 403, an organic light-emitting layer 404, an electron injection layer 405, an electron transport layer 406, a cathode 407, etc. Here, an evaporation method or an inkjet printing method may be used to form the hole injection layer 402 and the hole transport layer 403, the organic light-emitting layer 404, the electron injection layer 405, the electron transport layer 406, and the cathode 407. In the prior art, since the OLED display substrate is easily made into a flexible display substrate, it is preferable in an embodiment of this disclosure that the flexible display substrate motherboard is an OLED display substrate.

Figure 4:
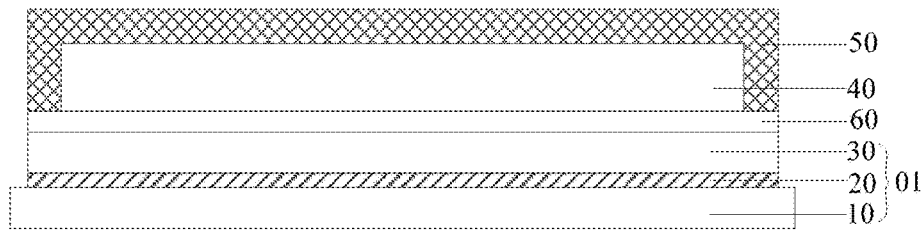
FIG. 4 is a second structural schematic diagram of a flexible display substrate motherboard provided in an embodiment of this disclosure.

According to an embodiment of this disclosure, in order to ensure the evenness of the display element 40 formed, as shown in FIG. 4, it is further preferable that a flat buffering layer 60 may be formed before the display element 40 is formed on the flexible base substrate 30. Here, the material of the flat buffering layer 60 may be, for example, silicon nitride. The thickness of the flat buffering layer 60 is preferably about 0.5 μm.

Furthermore, the material of the encapsulating layer 50 is not limited, as long as it can coat the display element 40 and allows the flexible display substrate motherboard to have a good sealing property.

Figure 6:
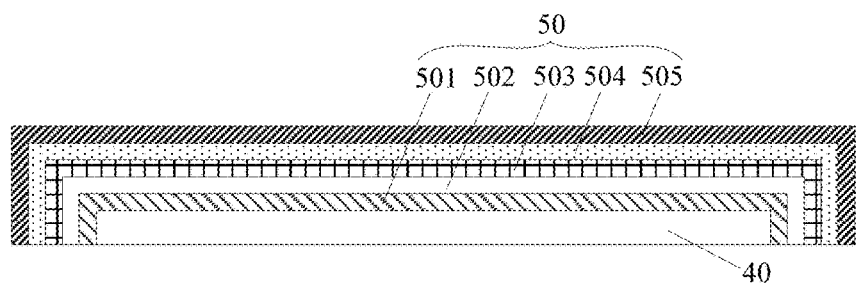
FIG. 6 is a structural schematic diagram of an encapsulating layer provided in an embodiment of this disclosure.

As shown in FIG. 6, it is preferable in an embodiment of this disclosure that the encapsulating layer 50 comprises at least two layers and the encapsulating layer 50 sequentially comprises at least two layers of a protective layer 501, a compact layer 502, a coating layer 503, a stress release layer 504, and a soft layer 505 along the direction from the support substrate 10 to the flexible base substrate 30. Here, the protective layer 501 is used for protecting the cathode 407, the material of the protective layer 501 may be, for example, an organic material, and the protective layer 501 may be formed on the cathode 407 by an evaporation method. The compact layer 502 has a good compactness and may prevent the display element 40 from being brought into contact with water vapor, oxygen, etc., and the material of the compact layer 502 may be, for example, silicon nitride. The coating layer 503 has as relatively good coating property, and can prevent the display element 40 from being brought into contact with water vapor, oxygen, etc., when the compact layer 502 has a crack. The material of the coating layer 503 may be, for example, aluminum oxide, and the coating layer 503 may be formed by a method of atomic layer deposition. The stress release layer 504 is used for releasing stress when the flexible display substrate is pressed, and the material of the stress release layer 504 may be, for example, a laminated material of silicon nitride and silicon oxide. At this point, silicon nitride may get close to the flexible base substrate 30, or silicon oxide may get close to the flexible base substrate 30. Since silicon nitride has a relatively good compactness, it is preferable that silicon nitride is provided to get close to the flexible base substrate 30. Since the flexible display substrate motherboard is flexible, the topmost layer in the encapsulating layer 50 is the soft layer 505, and the material of the soft layer 505 may be, for example, polyimide, polystyrene, etc.

An embodiment of this disclosure provides a flexible display substrate motherboard. Since the substrate assembly 01 of the flexible display substrate motherboard comprises the connecting layer 20 and the material of the connecting layer 20 is mainly composed of an organic layered material and the molecule constituting the organic layered material comprises a hydrophilic group, there is a very strong hydrogen bond action between the molecule of a polar solvent comprising a hydroxy group and the hydrophilic group when the substrate assembly 01 is placed in the atmosphere of the polar solvent comprising a hydroxy group. Therefore, the molecule of the polar solvent comprising a hydroxy group will be easily inserted into a space between layers of the organic layered material, so that the organic layered material is swollen and separated. Thus, the support substrate 10 and the flexible base substrate 30 will be easily exfoliated. Compared to support substrates 10 and flexible base substrates 30 in the conventional physical separated flexible display substrate motherboards, the support substrate 10 and the flexible base substrate 30 are skillfully and gently separated by swelling and separation of the organic layered material in embodiments of this disclosure, and therefore the damage of the support substrate 10 and the flexible base substrate 30 upon separation may be avoided and the deformation of the display element 40 on the flexible base substrate 30 due to stress may be avoided. On this basis, since the materials of the connecting layer 20 are organic layered materials and the organic layered materials are all small molecule or oligomer materials rather than higher polymer materials, the bulging phenomenon of the organic layered material will not occur even if the temperature is relatively high when the display element 40 is formed on the flexible base substrate 30. The evenness of the display element 40 formed on the flexible base substrate 30 may be in turn ensured, and the electric property uniformity and the yield rate of the display element 40 will not be affected.

Figure 7:
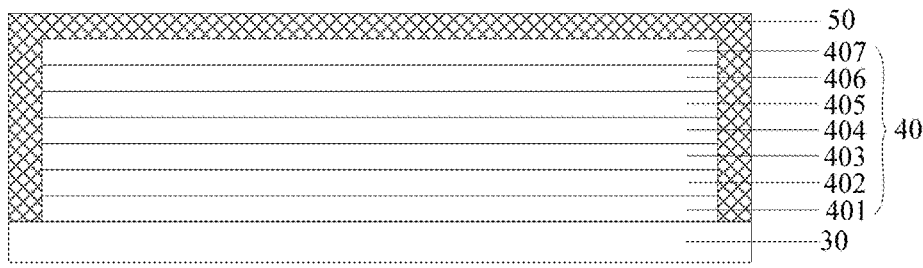
FIG. 7 is a structural schematic diagram of a flexible display substrate provided in an embodiment of this disclosure.

An embodiment of this disclosure provides a flexible display substrate, as shown in FIG. 7, which is obtained by peeling the flexible base substrate 30 of the flexible display substrate motherboard described above from the support substrate 10.

Here, the flexible display substrate motherboard comprises a support substrate 10, a connecting layer 20 and a flexible base substrate 30 formed on the support substrate 10, and a display element 40 and an encapsulating layer 50 formed on the flexible base substrate 30. After the flexible base substrate 30 is exfoliated from the support substrate 10, it is possible to obtain a flexible base substrate 30 and a display element 40 and an encapsulating layer 50 formed on the flexible base substrate 30, i.e., a flexible display substrate.

According to an embodiment of this disclosure, since the flexible display substrate motherboard comprises the connecting layer 20 and the material of the connecting layer 20 is mainly composed of an organic layered material and the molecule constituting the organic layered material comprises a hydrophilic group, there is a very strong hydrogen bond action between the molecule of a polar solvent comprising a hydroxy group and the hydrophilic group when the substrate assembly 01 is placed in the atmosphere of the polar solvent comprising a hydroxy group. Therefore, the molecule of the polar solvent comprising a hydroxy group will be easily inserted into a space between layers of the organic layered material, so that the organic layered material is swollen and separated. Thus, the support substrate 10 may be easily exfoliated from the flexible base substrate 30.

Based on those described above, with respect to the exfoliation of the flexible base substrate 30 and the support substrate 10 of the flexible display substrate motherboard, the support substrate 10 and the flexible base substrate 30 are skillfully and gently separated by swelling and separation of the organic layered material, and therefore the damage of the resultant flexible display substrate may be avoided and the deformation of the display element 40 in the flexible display substrate due to stress may be avoided. On this basis, the flexible display substrate in an embodiment of this disclosure is obtained by peeling the flexible base substrate 30 from the support substrate 10 of the flexible display substrate motherboard. In the process of forming the flexible display substrate motherboard, since the organic layered materials are all small molecule or oligomer materials rather than higher polymer materials, the bulging phenomenon of the organic layered material will not occur even if the temperature is relatively high when the display element 40 is formed on the flexible base substrate 30. The evenness of the display element 40 formed on the flexible base substrate 30 may be in turn ensured, and the properties of the display element 40 will not be affected. Therefore, it may ensure that the flexible display substrate obtained by exfoliation has a good electric property uniformity and a good yield rate.

An embodiment of this disclosure provides a flexible display, comprising the flexible display substrate described above.

The flexible display provided in embodiments of this disclosure may be any apparatus which displays either motive (for example, videos) or fixed (for example, static images) images (either texts or pictures). More clearly, it is expected that the embodiments may be implemented in various electronic apparatuses or associated with various electronic apparatuses. The various electronic apparatuses are, for example, but not limited to, mobile phones, wireless devices, personal digital assistants (PDAs), hand-held or portable computers, GPS receptors/navigators, cameras, MP3 players, video cameras, game consoles, watches, clocks, calculators, television monitors, flat panel displays, computer monitors, automobile displays (for example, odometer displays, etc.), navigation devices, cabin controllers and/or displays, displays of camera views (for example, displays of rear-view cameras in vehicles), electronic photos, electronic advertising boards or sign boards, projectors, building structures, packages and aesthetic structures (for example, a display of an image for a piece of jewelry), etc., or may be display members such as flexible display panels, etc.

The flexible display in an embodiment of this disclosure comprises a flexible display substrate and the flexible display substrate is obtained by separating the flexible base substrate 30 of the flexible display motherboard from the support substrate 10, and therefore the damage of the flexible display substrate in the flexible display may be avoided and the deformation of the display element 40 in the flexible display due to stress may be avoided. Furthermore, since the display element 40 in the flexible display has a good evenness, the electric property uniformity and the yield rate of the flexible display are improved.

Figure 8:
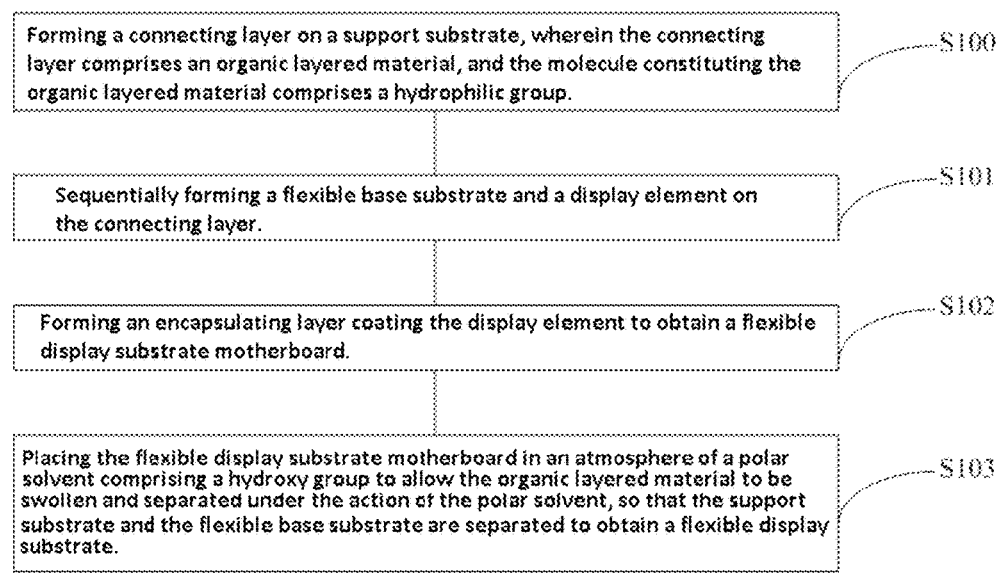
FIG. 8 is a schematic flow chart of a production method of a flexible display substrate provided in an embodiment of this disclosure.
Figure 9:
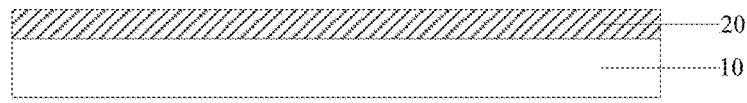
FIG. 9 is a structural schematic diagram of forming a connecting layer on a support substrate provided in an embodiment of this disclosure.

An embodiment of this disclosure further provides a production method of a flexible display substrate, as shown in FIG. 8, comprising:

S100, as shown in FIG. 9, forming a connecting layer 20 on a support substrate 10; here, the material of the connecting layer 20 is an organic layered material and the molecule constituting the organic layered material comprises a hydrophilic group.

Here, the hydrophilic group in the molecular structure of the organic layered material is not limited. The hydrophilic group may be, for example, —OH, —CHO, —COOH, —NH$_2$, —SO$_3$H, etc. Furthermore, the molecular structure of the organic layered material may comprise one hydrophilic group, or may comprise various hydrophilic groups.

Figure 10:
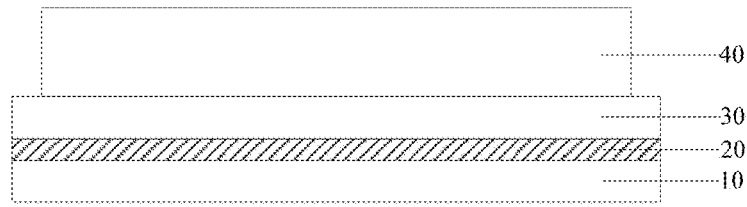
FIG. 10 is a structural schematic diagram of forming a display element on a substrate assembly provided in an embodiment of this disclosure.

S101, as shown in FIG. 10, sequentially forming a flexible base substrate 30 and a display element 40 on the connecting layer 20.

Here, the material of the flexible base substrate 30 is not limited, and for example, may be polyimide, polystyrene, etc.

Here, the type of the flexible display substrate is not limited, and may be a LCD display substrate or may be an OLED display substrate. When the flexible display substrate is an OLED display substrate, as shown in FIG. 5, the display element 40 comprises an anode 401, a hole injection layer 402 and a hole transport layer 403, an organic light-emitting layer 404, an electron injection layer 405, an electron transport layer 406, a cathode 407, etc.

Figure 3:
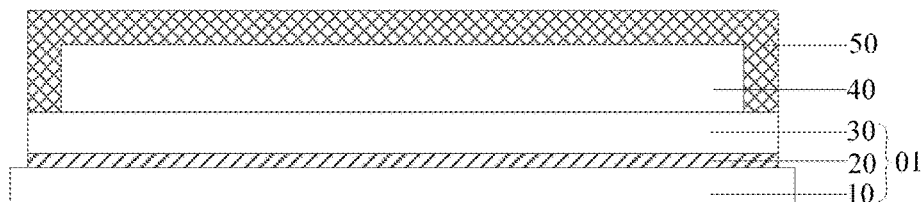
FIG. 3 is a first structural schematic diagram of a flexible display substrate motherboard provided in an embodiment of this disclosure.

S102, as shown in FIGS. 3-5, forming an encapsulating layer 50 coating the display element 40 to obtain a flexible display substrate motherboard.

Here, the material of the encapsulating layer 50 is not limited, as long as it can coat the display element 40 and allows the flexible display substrate motherboard to have a good sealing property.

S103, placing the flexible display substrate motherboard as shown in FIGS. 3-5 in an atmosphere of a polar solvent comprising a hydroxy group to allow the organic layered material to be swollen and separated under the action of the polar solvent, so that the support substrate 10 is separated from the flexible base substrate 30 to obtain a flexible display substrate as shown in FIG. 7.

Here, the type of the polar solvent comprising a hydroxy group is not limited. The polar solvent comprising a hydroxy group may be, for example, water, methanol, ethanol, etc. Since water has a relatively large polarity and a low price, the polar solvent comprising a hydroxy group is preferably water.

Here, placing the flexible display substrate motherboard in an atmosphere of a polar solvent comprising a hydroxy group may be placing the flexible display substrate motherboard in a polar solvent comprising a hydroxy group or may be placing the flexible display substrate motherboard in a vapor atmosphere of a polar solvent comprising a hydroxy group.

It is to be indicated that placing the flexible display substrate motherboard in an atmosphere of a polar solvent comprising a hydroxy group may be placing the whole of the flexible display substrate motherboard in an atmosphere of a polar solvent comprising a hydroxy group or may be placing a part of the flexible display substrate motherboard in an atmosphere of a polar solvent comprising a hydroxy group. On this basis, in order to prevent the effect of the polar solvent comprising a hydroxy group on the display element 40 in the flexible display substrate motherboard, it is further preferable that the support substrate 10, the connecting layer 20, and the flexible base substrate 30 in the flexible display substrate motherboard may be merely placed in the atmosphere of the polar solvent comprising a hydroxy group.

Furthermore, when the flexible display substrate motherboard is placed in the atmosphere of the polar solvent comprising a hydroxy group, since the connecting layer 20 in the flexible display substrate motherboard comprises a hydrophilic group and there is a very strong hydrogen bond action between the hydrophilic group and the molecule of the polar solvent comprising a hydroxy group, the molecule of the polar solvent comprising a hydroxy group will be easily inserted between sheet layers of the organic layered material under the action of the hydrogen bond, thereby resulting in swelling of the layer material. When the process of swelling progresses to a certain extent, there is no longer correlation between the sheet layers of the organic layered material, so that the separation occurs between layers. The separation of sheet layers of the organic layered material will allow the support substrate 10 and the flexible base substrate 30 to be separated, and the flexible display substrate may be in turn obtained.

According to an embodiment of this disclosure provides in the production method of the flexible display substrate, the support substrate 10 and the flexible base substrate 30 are skillfully and gently separated by swelling and separation of the organic layered material in the flexible display substrate motherboard to obtain the flexible display substrate, and therefore the damage of the resultant flexible display substrate may be avoided and the deformation of the display element 40 in the flexible display substrate due to stress may be avoided. On this basis, the flexible display substrate in an embodiment of this disclosure is obtained by peeling the flexible base substrate 30 of the flexible display substrate motherboard from the support substrate 10. In the process of forming the flexible display substrate motherboard, since the organic layered materials are all small molecule or oligomer materials rather than higher polymer materials, the bulging phenomenon of the organic layered material will not occur even if the temperature is relatively high when the display element 40 is formed on the flexible base substrate 30. The evenness of the display element 40 formed on the flexible base substrate 30 may be in turn ensured, and the properties of the display element 40 will not be affected. Therefore, it may ensure that the flexible display substrate obtained by exfoliation has a good electric property uniformity and a good yield rate.

Preferably, the flexible display substrate motherboard is placed in the atmosphere of the polar solvent comprising a hydroxy group, and the method described above further comprises: subjecting the flexible display substrate motherboard to heating or ultrasonication.

According to an embodiment of this disclosure, the flexible display substrate motherboard is placed in the atmosphere of the polar solvent comprising a hydroxy group. When the flexible display substrate motherboard is subjected to heating or ultrasonication, more molecules of the polar solvent comprising a hydroxy group will enter between sheet layers of the organic layered material more rapidly under the action of the hydrogen bond, thereby leading to swelling and separation of the organic layered material, so as to accelerate the swelling and the separation of the support substrate 10 and flexible base substrate 30.

Preferably, forming a connecting layer 20 on a support substrate 10 specifically comprises: coating a solution in which an organic material is dissolved on the support substrate 10, and precipitating an organic layered material on the support substrate 10 using a crystallization process to form a connecting layer. Here, the molecular structure of the organic material comprises a hydrophilic group.

Here, the organic solvent for dissolving the organic material is not limited. A corresponding organic solvent may be selected according to the type of the organic material to allow the organic material to be dissolved in the organic solvent. On this basis, the particular processing parameters, for example temperature, of the crystallization process are not limited, as long as the organic layered material is precipitated on the support substrate 10. The crystallization processing parameters may be determined according to the solubility and the like of the organic material in a corresponding organic solvent.

According to an embodiment of this disclosure, the organic layered material may be precipitated on the support substrate 10 using a crystallization process so as to form the connecting layer 20. Since the molecular structure of the organic material comprises a hydrophilic group, the molecular structure of the organic layered material formed on the support substrate 10 also comprises a hydrophilic group.

The above embodiments are only specific embodiments of the disclosure, but the scope of the disclosure is not limited thereto. Within the technical scope disclosed by this disclosure, any person skilled in the art will easily conceive variations or replacements, which should be covered by the scope of the disclosure. Therefore, the protection scope of the disclosure should be determined by the protection scope of the claims.

What is claimed is:

1. A substrate assembly, comprising a support substrate as well as a connecting layer and a flexible base substrate which are sequentially formed on the support substrate, wherein the connecting layer is composed of an organic layered material, a molecule constituting the organic layered material comprises a hydrophilic group, and the organic layered material is a material composed of two or more sheet layers, wherein an interior of each two-dimensional layer of the two or more sheet layers is bonded via a chemical bond and there is only a Van-der-Waals force between adjacent layers.

2. The substrate assembly according to claim 1, wherein the molecule constituting the organic layered material is an organic linear molecule.

3. The substrate assembly according to claim 2, wherein the organic linear molecule is a small molecule or an oligomer.

4. The substrate assembly according to claim 1, wherein the connecting layer has a thickness in a range of 10 to 100 nm.

5. The substrate assembly according to claim 1, wherein the molecule constituting the organic layered material comprises a group capable of being ionized by a polar solvent comprising a hydroxy group.

6. The substrate assembly according to claim 1, wherein the hydrophilic group is capable of being ionized by a polar solvent comprising a hydroxy group.

7. The substrate assembly according to claim 1, wherein the hydrophilic group is one or more selected from the group consisting of a hydroxy group, an aldehyde group, a carboxy group, an amino group, a phosphoric acid group, and a sulfonic acid group.

8. The substrate assembly according to claim 1, wherein a border of the flexible base substrate is within a border of the connecting layer when looking from a direction vertical to a surface of the flexible base substrate.

9. A flexible display substrate motherboard, comprising the substrate assembly of claim 1 as well as a display element formed on the flexible base substrate of the substrate assembly and an encapsulating layer encapsulating the display element.

10. A flexible display substrate, which is obtained by peeling the flexible base substrate of the flexible display substrate motherboard according to claim 9 from the support substrate.

11. A flexible display, comprising the flexible display substrate of claim 10.

12. A production method of a flexible display substrate, comprising the steps of:
a) forming a connecting layer on a support substrate, wherein the connecting layer is composed of an organic layered material, and a molecule constituting the organic layered material comprises a hydrophilic group, and the organic layered material is a material composed of two or more sheet layers, wherein an interior of each two-dimensional layer of the two or more sheet layers is bonded via a chemical bond and there is only a Van-der-Waals force between adjacent layers;
b) sequentially forming a flexible base substrate and a display element on the connecting layer;
c) forming an encapsulating layer encapsulating the display element to obtain a flexible display substrate motherboard; and
d) placing the flexible display substrate motherboard in an atmosphere of a polar solvent comprising a hydroxy group to allow the organic layered material to be swollen and separated under action of the polar solvent, so that the support substrate and the flexible base substrate are separated to obtain a flexible display substrate.

13. The production method according to claim 12, wherein in step d), the method further comprises the step of:
subjecting the flexible display substrate motherboard to heating or ultrasonication.

14. The production method according to claim 12, wherein in step a), the method comprises the step of:
coating a solution in which an organic material is dissolved on the support substrate, and precipitating an organic layered material on the support substrate using a crystallization process to form the connecting layer, wherein a molecule constituting the organic material comprises a hydrophilic group.

15. The production method according to claim 14, wherein the molecule constituting the organic layered material is an organic linear molecule.

16. The production method according to claim 15, wherein the organic linear molecule is a small molecule or an oligomer.

17. The production method according to claim 14, wherein the connecting layer has a thickness in a range of 10 to 100 nm.

18. The production method according to claim 14, wherein the hydrophilic group is capable of being ionized by a polar solvent comprising a hydroxy group.

* * * * *